(12) United States Patent
Nakao et al.

(10) Patent No.: US 7,486,711 B2
(45) Date of Patent: Feb. 3, 2009

(54) AUTOMATIC POWER CONTROL FILTER CIRCUIT AND OPTICAL DISC DEVICE

(75) Inventors: Akira Nakao, Yokohama (JP); Takashi Inoue, Yokohama (JP); Yasuhiro Hayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 11/672,198

(22) Filed: Feb. 7, 2007

(65) Prior Publication Data

US 2007/0183468 A1 Aug. 9, 2007

(30) Foreign Application Priority Data

Feb. 8, 2006 (JP) .............................. 2006-031411

(51) Int. Cl.
*H01S 3/00* (2006.01)
(52) U.S. Cl. .............. 372/38.02; 372/38.07; 372/38.01; 372/38.1
(58) Field of Classification Search .............. 372/38.02, 372/38.07, 38.01, 38.1
See application file for complete search history.

(56) References Cited

U.S. PATENT DOCUMENTS

| | | | |
|---|---|---|---|
| 5,732,061 A * | 3/1998 | Kirino et al. ................ | 369/116 |
| 5,872,763 A | 2/1999 | Osakabe | |
| 6,781,105 B2 * | 8/2004 | Yokoi ...................... | 250/201.5 |
| 6,839,310 B2 | 1/2005 | Yoshida | |
| 2002/0196717 A1 * | 12/2002 | Masui et al. ............. | 369/44.29 |
| 2003/0112732 A1 * | 6/2003 | Masui et al. ............. | 369/59.12 |
| 2004/0047263 A1 * | 3/2004 | Xang et al. ............. | 369/53.26 |
| 2004/0144909 A1 * | 7/2004 | Tateishi et al. ............. | 250/205 |
| 2005/0025031 A1 | 2/2005 | Kodama et al. | |

FOREIGN PATENT DOCUMENTS

JP 2003-308623 10/2003

* cited by examiner

*Primary Examiner*—Minsun Harvey
*Assistant Examiner*—Kinam Park
(74) *Attorney, Agent, or Firm*—Oblon, Spivak, McClelland, Maier & Neustadt, P.C.

(57) ABSTRACT

An automatic power control filter circuit that outputs a signal corrected to make a laser drive current for driving a laser light emitting element irradiating an optical disc with a laser beam become a desired value, on the basis of a signal obtained by sampling and holding a light emission monitor signal corresponding to an output current of a photodetector for detecting output power of the laser light emitting element.

8 Claims, 4 Drawing Sheets

AUTOMATIC POWER CONTROL FILTER CIRCUIT AND OPTICAL DISC DEVICE

CROSS-REFERENCE TO RELATED APPLICATIONS

This application is based upon and claims the benefit of priority from the prior Japanese Patent Application No. 2006-31411, filed on Feb. 8, 2006, the entire contents of which are incorporated herein by reference.

BACKGROUND OF THE INVENTION

1. Field of the Invention

The present invention relates to an automatic power control filter circuit for controlling laser power irradiated to an optical disc and an optical disc device provided with the automatic power control filter circuit.

2. Background Art

A conventional optical disc device discriminates various kinds of optical disc media, and performs control for reproducing and recording operations corresponding to the respective media.

For example, read-only CD-ROM and DVD-ROM, write-once CR-R and DVD-R, rewritable CD-RW and DVD-RW, or the like, are different from each other in the recording power and the reading power of a laser diode, and hence, it is necessary for the optical disc device to control the drive current of the laser diode.

Among these conventional optical disc devices, for example, there is an optical disc device provided with a laser which performs the recording or reproducing operation by irradiating an optical disc with light, a light monitor element which receives a part of the light emitted by the laser in the direction of the optical disc, a correcting device which outputs a correction signal obtained by non-linearly correcting an output signal of the light monitor element in accordance with a level of an input signal of a laser power driving device or a level of an output signal of the light monitor element (light emission monitor signal), and the laser power driving device which drives the laser in accordance with the input signal and the correction signal (see, for example, Japanese Patent Laid-Open Publication No. 2003-308623).

Here, a procedure is often performed for determining the optimum recording power by making a recording operation performed with the power optionally changed with respect to a recording power initial value, and by making the quality of a reproduced waveform after the recording operation measured. The procedure is referred to as optimum power control (OPC) in the optical disc industry.

However, in the case where the correcting device is, for example, constituted in such a manner that when a recording power fine adjustment coefficient is changed, errors between input data corresponding to light emission monitor signals and data corresponding to a target power are integrated, there is a problem that it takes much time until the output of the laser is stabilized, in the case of an optical disc device having a narrow loop band.

SUMMARY OF THE INVENTION

According one aspect of the present invention, there is provided: an automatic power control filter circuit which outputs a signal corrected to make a laser drive current for driving a laser light emitting element irradiating an optical disc with a laser beam become a desired value, on the basis of a signal obtained by sampling and holding a light emission monitor signal corresponding to an output current of a photodetector for detecting output power of the laser light emitting element, comprising an offset adjusting circuit which measures and stores an offset voltage of the signal sampled and held when the laser is prevented from emitting light; a first operation circuit which performs offset correction by calculating the offset voltage stored in the offset adjusting circuit and the signal sampled and held when the laser is allowed to emit light; a second operation circuit which calculates an error by comparing a value corrected by the first operation circuit with a value obtained by multiplying a target value by a desired coefficient in order to perform optimum power control; an integrator which integrates the error calculated by the second operation circuit; and a third operation circuit which performs calculation of the output of the integrator and a voltage value obtained by multiplying a desired boost voltage value by the coefficient, and outputs the calculation result, wherein the target value and the boost voltage value are respectively multiplied by the coefficient at the same timing as the optimum power control is performed.

According further aspect of the present invention, there is provided: an optical disc device comprising a laser light emitting element which irradiates optical disc with a laser beam; a beam splitter which divides the laser beam; an objective lens which irradiates the optical disc with a part of the divided laser beam; a photodetector which receives a part of the divided laser beam and detects output power of the laser light emitting element; a current-voltage conversion circuit which converts an output current of the photodetector into a light emission monitor signal; a plurality of sample hold circuits which sample and hold the light emission monitor signal synchronously with a sample pulse on the basis of which laser power for recording marks or spaces to the optical disc is sampled; analog-digital converters which analog-digital convert output signals of the sample hold circuits; a plurality of automatic power control filter circuits which correct analog-digital converted output signals of the sample hold circuits to have desired values, and output the corrected signals; a system controller by which the automatic power control filter circuits are controlled to output desired signals; digital-analog converters which digital-analog convert the output signals of the automatic power control filter circuits, and output drive current instruction signals that instruct laser drive currents for driving the laser light emitting element; voltage-current conversion circuits which respectively convert the plurality of drive current instruction signals into a plurality of laser drive currents; a plurality of switch circuits which turn on and off the plurality of laser drive currents; and an adder which adds the laser drive currents outputted via the switch circuits, and outputs the resultant current to the laser light emitting element, wherein the automatic power control filter circuits comprise an offset adjusting circuit which measures and stores an offset voltage of the signal sampled and held when the laser is prevented from emitting light; a first operation circuit which performs offset correction by calculating the offset voltage stored in the offset adjusting circuit and the signal sampled and held when the laser is allowed to emit light; a second operation circuit which calculates an error by comparing a value corrected by the first operation circuit with a value obtained by multiplying a target value by a desired coefficient in order to perform optimum power control; an integrator which integrates the error calculated by the second operation circuit; and a third operation circuit which performs calculation of the output of the integrator and a voltage value obtained by multiplying a desired boost voltage value by the coefficient, and outputs the calculation result, wherein the target value and the boost voltage value are respectively multiplied by the coefficient at the same timing as the optimum power control is performed.

DETAILED DESCRIPTION

The present invention utilizes linear parts of characteristics curve of a laser diode.

An optical disc device according to the present invention quickly changes the laser drive current, for example, when performing optimum power control (OPC) which changes laser power at a fixed rate from initial recording power to perform the recording.

In the following, each embodiment according to the present invention will be described with reference to the accompanying drawings.

Embodiment 1

Figure 1:
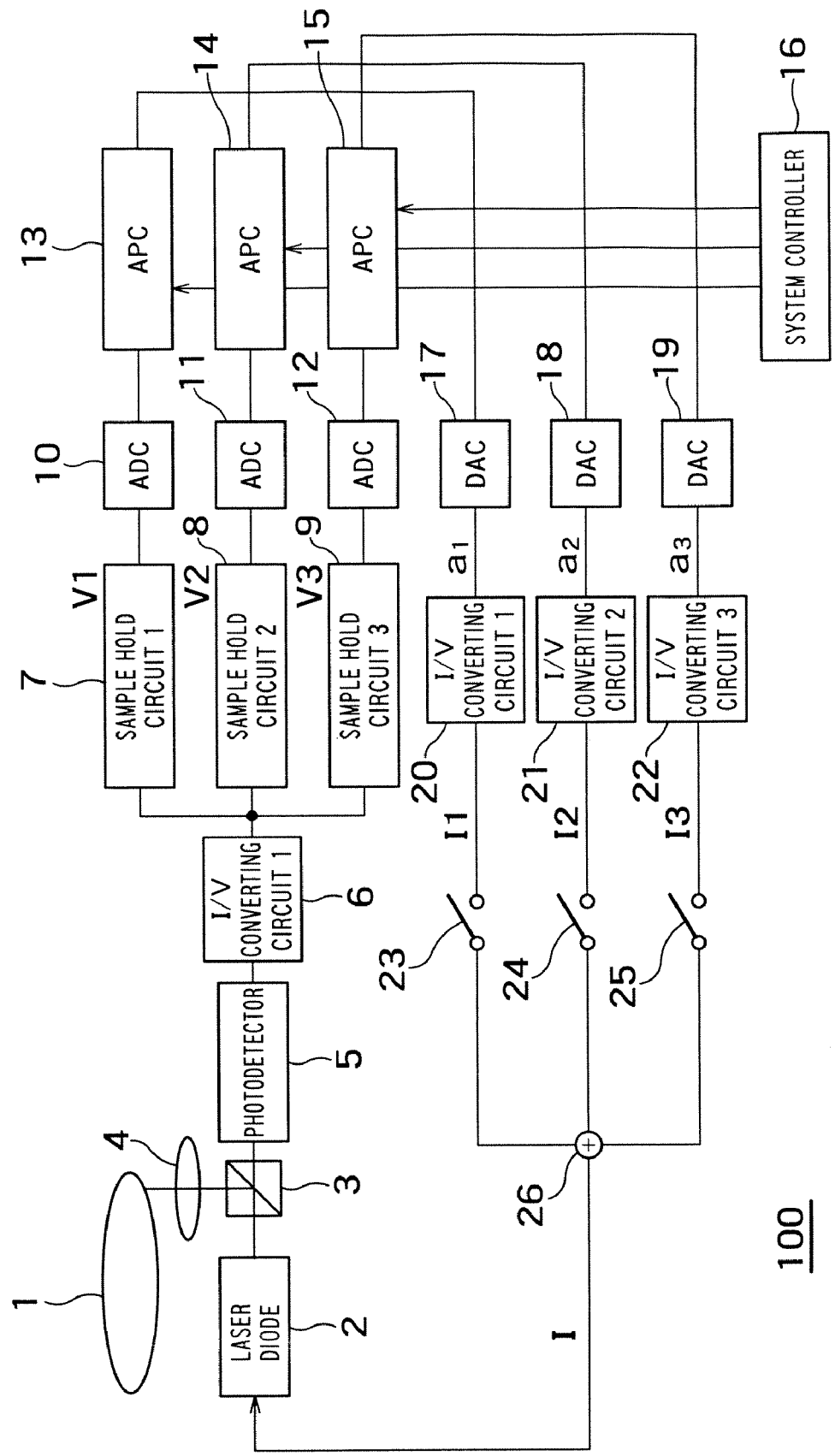
FIG. 1 is a figure showing a configuration of a main part of an optical disc device according to an embodiment 1 of the present invention.
Figure 2:
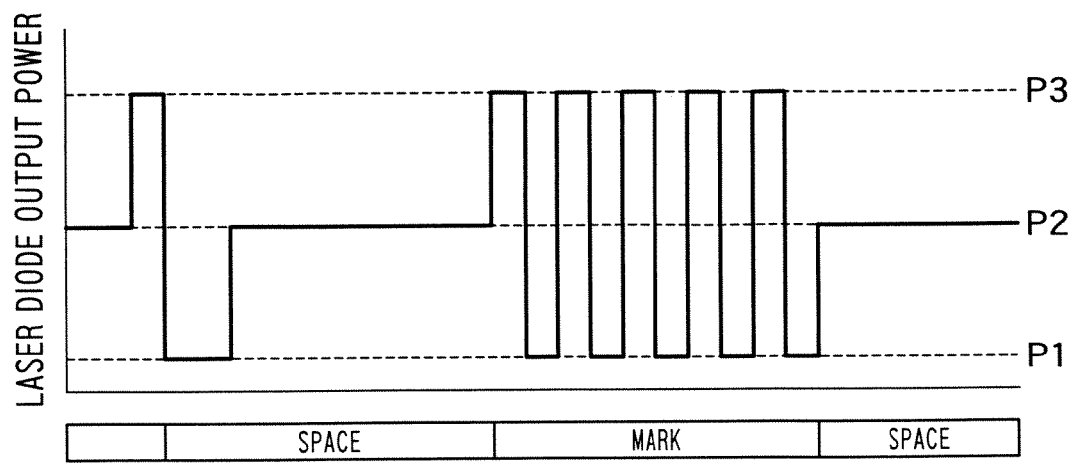
FIG. 2 is a figure showing a waveform of output power of a laser diode when marks and spaces are recorded to the optical disc.
Figure 3:
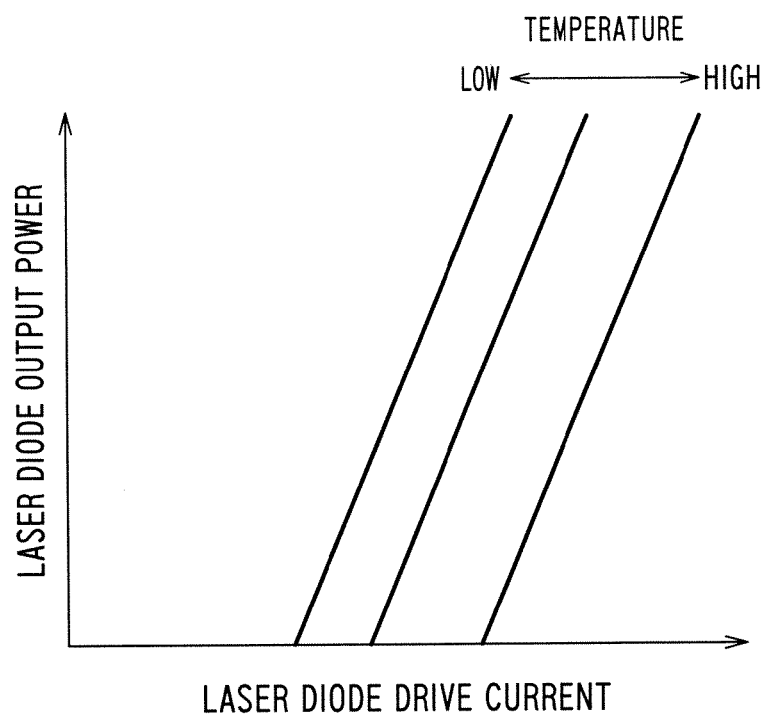
FIG. 3 is a figure showing a relation of the laser drive current of the laser diode and the output power of the laser diode to the temperature change.

FIG. 1 is a figure showing a configuration of a main part of an optical disc device according to an embodiment 1 of the present invention. Furthermore, FIG. 2 is a figure showing a waveform of output power of a laser diode when marks and spaces are recorded to the optical disc. Furthermore, FIG. 3 is a figure showing a relation of the laser drive current of the laser diode and the output power of the laser diode to the temperature change.

As shown in FIG. 1, an optical disc device 100 is provided with a laser diode 2 which is a laser light emitting element for irradiating an optical disc 1, a beam splitter 3 which divides the laser beam, an objective lens 4 which irradiates the optical disc 1 with a part of the divided laser beam, a photodetector 5 which receives a part of the divided laser beam and detects the output power of the laser diode 2, and a current-voltage (IV) conversion circuit 6 which converts the output current of the photodetector 5 into a light emission monitor signal M which is a voltage signal.

Furthermore, the optical disc device 100 is provided with a plurality of sample hold circuits 7, 8 and 9 which sample and hold the light emission monitor signal M synchronously with a sample pulse for sampling the laser power with which the marks and spaces are recorded to the optical disc, and a plurality of analog-digital converters (ADC) 10, 11 and 12 which perform analog-digital conversion of outputs V1, V2 and V3 of the sample hold circuits 7 to 9, respectively.

Furthermore, the optical disc device 100 is provided with a plurality of automatic power control (APC) filter circuits 13, 14 and 15 which correct the analog-digital converted outputs of the sample hold circuits 7 to 9 to desired values and output the corrected signals, and a system controller 16 which controls the APC filter circuits 13 to 15 so as to make the APC filter circuits output desired signals.

Furthermore, the optical disc device 100 is provided with digital-analog converters (DAC) 17, 18 and 19 which perform digital-analog conversion of respective output signals of the APC filter circuits 13 to 15, and output respective drive current instruction signals a1, a2 and a3 which instruct the laser drive current for driving the laser light emitting element.

Furthermore, the optical disc device 100 is provided with a plurality of voltage-current (VI) conversion circuits 20, 21 and 22 which respectively convert the plurality of drive current instruction signals a1 to a3 which are voltage signals, into a plurality of laser drive currents I1, I2 and I3, a plurality of switch circuits 23, 24 and 25 which respectively turn on and off the plurality of drive currents I1 to I3, and an adder 26 which adds the laser drive currents I1 to I3 outputted via these switch circuits 23 to 25, and outputs the resultant current to the laser diode 2.

It should be noted that the system controller 16 controls the APC filter circuits 13 to 15 on the basis of a signal read from the optical disc and conditions set in advance.

Here, as shown in FIG. 2, the output power of the laser diode 2 is made different in accordance with the mark and the space. When the mark is recorded, for example, a multipulse system which finely modulates the laser power as shown in the figure is adopted.

It should be noted that in the figure, the output power P1 represents a base level, the output power P2 represents an erase level, and the output power P3 represents a write level. These output powers P1 to P3 of the laser diode 2 can be obtained by controlling the laser drive current I by turning on and off the switch circuits 23 to 25.

For example, there is considered a case where the recording is performed at three levels, at the first level of which the output power P1 is outputted when a drive current I1 is inputted into the laser diode 2, at the second level of which the output power P2 is outputted when the drive currents I1 and I2 are inputted into the laser diode 2, and at the third level of which the output power P3 is outputted when the drive currents I1 and I3 are inputted into the laser diode 2.

In this case, the generation of light emitting pattern itself is realized by controlling the turning on and off of the laser drive currents I1, I2 and I3 at suitable timing, and in order to make the output powers P1, P2 and P3 kept constant, the APC filter circuits 13 to 15 control the laser drive currents I1 to I3, by using the respective light emission monitor signals M1 to M3 which are proportional to the output powers P1, P2 and P3.

Furthermore, as shown in FIG. 3, when a constant current is allowed to flow through the laser diode 2, the emitting power thereof is changed with temperature. Thus, in order to accurately record the marks and the spaces to the medium, the optical disc device 100 monitors the emitting power and changes the laser drive current I so as to make the emitting power kept constant.

Specifically, the APC filter circuits 13 to 15 output signals which are corrected so as to allow the laser drive current I for driving the laser diode 2 to become a desired value, on the basis of the signals M1 to M3 which are obtained by sampling and holding the light emission monitor signal M corresponding to the output current of the photodetector 5 for measuring the output power of the laser diode 2.

Next, there is described an example of a detailed configuration of the APC filter circuit which performs the recording while changing the output power with respect to the recording power initial value at a predetermined rate, and thereby performs the optimum power control for determining optimum recording power.

Figure 4:
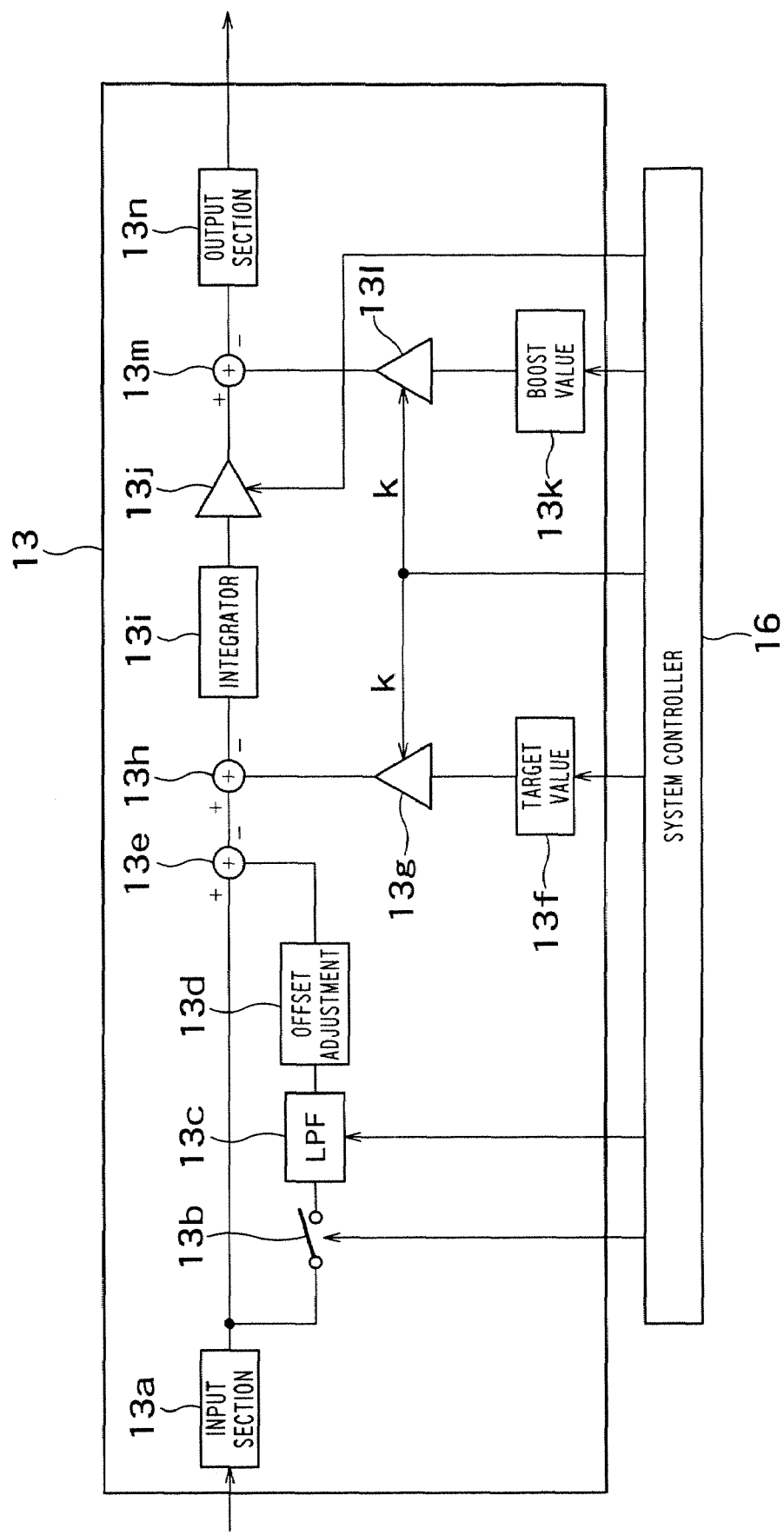
FIG. 4 is a figure showing a main part configuration of the APC filter circuit in FIG. 1, and the system controller.
Figure 5:
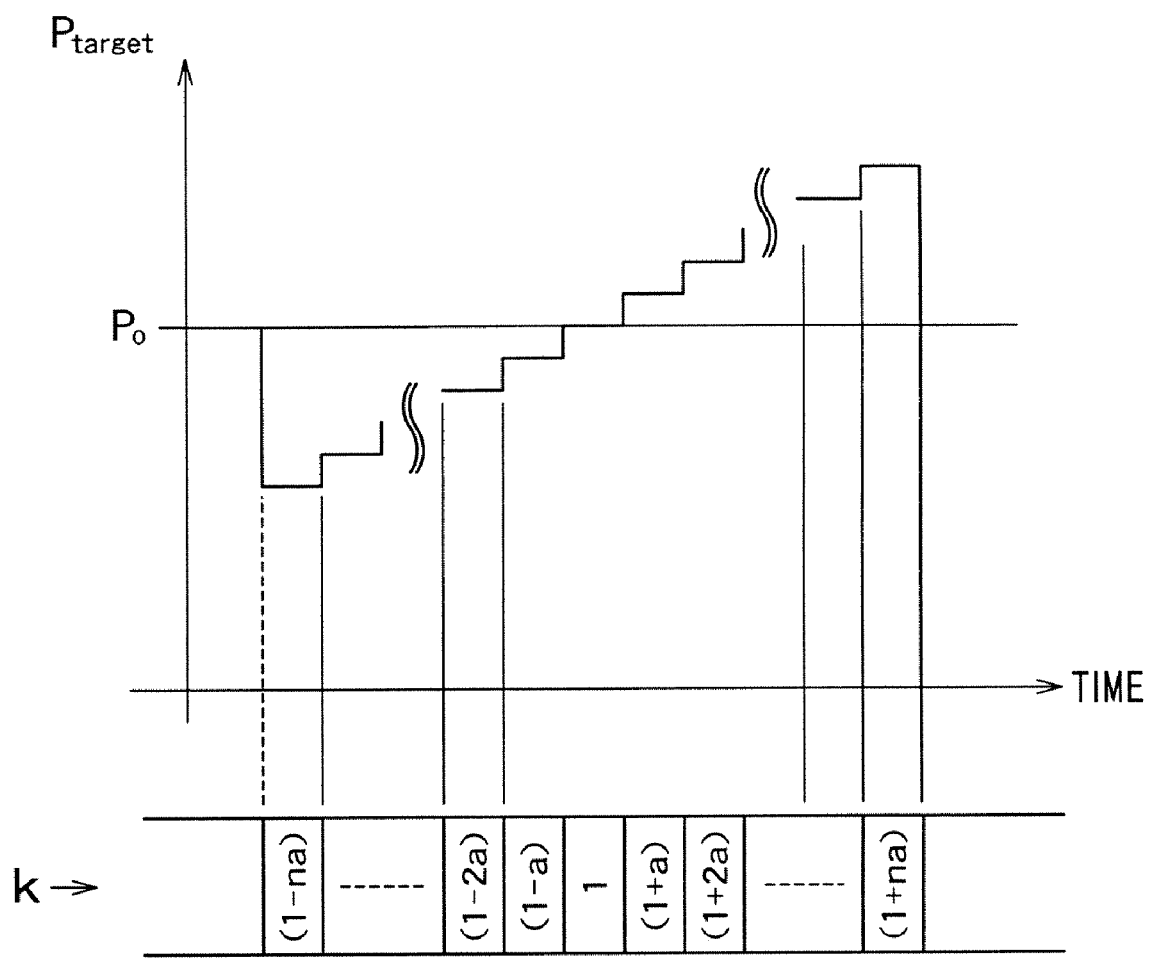
FIG. 5 is a figure showing the variation of the output power of the laser diode to which the optimum power control is performed by using the APC filter circuit in FIG. 4.

FIG. 4 is a figure showing a main part configuration of the APC filter circuit in FIG. 1, and the system controller. FIG. 5 is a figure showing the variation of the output power of the laser diode to which the optimum power control is performed by using the APC filter circuit in FIG. 4.

It should be noted that here the APC filter circuit 13 is explained, but the other APC filter circuits 14 and 15 also have the same configuration.

As shown in FIG. 4, the APC filter circuit 13 has an input section 13a to which an output of the sample hold circuit 7 (signal obtained by sampling and holding the light emission monitor signal) is inputted via the analog-digital converter 10, an offset adjusting circuit 13d which measures and stores an offset voltage of the output of the sample hold circuit 7, which offset voltage is obtained when the switch circuit 13b and the low pass filter circuit 13c are controlled by the system controller 16 and the laser is prevented from emitting light, and a first operation circuit 13e which performs offset correction by subtracting the offset voltage stored in the offset adjusting circuit 13d from the output of the sample hold circuit 7 at the time when the laser is made to emit light.

It should be noted that the offset adjusting circuit 13d, for example, measures and stores the offset voltage which is inputted into the offset adjusting circuit 13d while the switch circuit 13b is turned on by the system controller 16 in the state where the laser is preventing from emitting light.

On the other hand, when the laser is made to emit light, the switch circuit 13b is turned off by the system controller 16, so that a new signal is not inputted into the offset adjusting circuit 13d.

Furthermore, a target value is set to a voltage value obtained by subtracting the voltage value corresponding to the offset of the photodetector 5 from the voltage value corresponding to the current when the target output power of the laser diode 2 is detected by the photodetector.

Furthermore, the APC filter circuit 13 has a target value holding circuit 13f which holds the target value, a coefficient register 13g which multiplies the target value by a desired value k instructed by the system controller 16 in order to perform optimum power control, a second operation circuit 13h which compares the value corrected by the first operation circuit 13e with the multiplied value so as to calculate an error, and an integrator 13i which integrates the error calculated by the second operation circuit 13h.

Furthermore, the APC filter circuit 13 has a coefficient register 13j which multiplies the output of the integrator 13i by a desired coefficient in order to determine the gain of the APC loop so as to allow the APC loop relating to the APC filter circuit 13 of the optical disc device 100 to be stabilized, a boost voltage value holding circuit 13k which holds a boost voltage value, a coefficient register 13l which multiplies the boost voltage value by the coefficient "k" instructed by the system controller 16, a third operation circuit 13m which adds the output of the integrator 13i multiplied by the desired coefficient to a voltage value obtained by multiplying the boost voltage by the coefficient "k", and an output section 13n which outputs the operation value of the third operation circuit 13m as an output of the APC filter circuit 13.

It should be noted that the boost voltage value is a fixed voltage value corresponding to the laser drive current for enabling the laser diode 2 to output the target output power. An error and a change amount from the target value, which are given by the output of the integrator, are corrected (added) to the boost value, and the correction result is used as the target laser power.

The system controller 16 makes the target value holding circuit 13f hold the target value and output the target value to the second operation circuit 13h at a desired magnification factor. Furthermore, the system controller 16 makes the boost voltage value holding circuit 13k hold the boost voltage, and the output of the integrator 13i outputted at a desired magnification factor.

With the above described configuration, the APC filter circuit 13 outputs a signal which brings the laser drive current I1 close to a desired value on the basis of the signal obtained by sampling and holding the light emission monitor signal. That is, in the APC loop, the error between the target laser power of the APC filter circuit 13 and the detected laser power is controlled to become zero.

Then, when optimum power control is performed, the APC filter circuit 13 sets the boost voltage value to a suitable value, and makes each of the target value and the boosted voltage value multiplied by the coefficient "k" at the same timing as the optimum power control is performed.

Here, the target power becomes the sum of the boost value and the output of the integrator, as described above. In the present invention, it is necessary that the boost value is set to a suitable value to thereby allow the integrator to operate near the zero output. In the case where a certain error is corrected by the integrator (the output of the integrator is not zero), the error output of the integrator also becomes a multiple of the coefficient "k" at the time of respectively multiplying the target value and the boost value by the coefficient "k". Accordingly, it is necessary to wait for the value of the integrator to be converged, as a result of which a quick response cannot be realized.

Thus, if the integrated error amount is set near zero, the error amount remains near zero even by being multiplied by the coefficient, and hence, it is not necessary to wait for the value of the integrator to be changed. Furthermore, since the integrator operates near the zero output, it is possible to take a large dynamic range of the output of the integrator.

As a result, it is possible to change the output signal of the APC filter circuit 13 into a desired value, and to change the output power of the laser diode to a desired value, without waiting for the result of integration by the integrator 13i.

For example, as shown in FIG. 5, it is possible to change the output power $P_{target}$ of the laser diode 2 to a desired power from the recording power initial value $P_0$ by changing the coefficient "k". It should be noted that the coefficient "k" is prescribed by a desired rate "a" at which the output power is changed.

Thereby, even when the loop band of the optical disc device 100 including the APC filter circuit 13 is narrow, it is possible to quickly change the output power of the laser diode 2.

As described above, with the APC filter circuit according to the present embodiment, the target value and the boost voltage value are respectively multiplied by the coefficient at the same timing as the optimum power control is performed. This makes it possible to change the output signal of the APC filter circuit to a desired value, and to change the output of the laser diode to be changed to a desired value, without waiting for the result of integration by the integrator.

Therefore, even when the loop band is narrow, it is possible to quickly perform the optimum power control.

What is claimed is:

1. An automatic power control filter circuit which outputs a signal corrected to make a laser drive current for driving a laser light emitting element irradiating an optical disc with a laser beam become a desired value, on the basis of a signal obtained by sampling and holding a light emission monitor signal corresponding to an output current of a photodetector for detecting output power of the laser light emitting element, comprising:

an offset adjusting circuit which measures and stores an offset voltage of the signal sampled and held when the laser is prevented from emitting light;

a first operation circuit which performs offset correction by calculating the offset voltage stored in the offset adjusting circuit and the signal sampled and held when the laser is allowed to emit light;

a second operation circuit which calculates an error by comparing a value corrected by the first operation circuit with a value obtained by multiplying a target value by a desired coefficient in order to perform optimum power control;

an integrator which integrates the error calculated by the second operation circuit; and a third operation circuit which adds the output of the integrator to a voltage value obtained by multiplying a desired boost voltage value by the coefficient, and outputs the adding result, wherein the target value and the boost voltage value are respectively multiplied by the coefficient at the same timing as the optimum power control is performed.

2. The automatic power control filter circuit according to claim 1, further comprising:

a target value holding circuit which holds the target value;

a first coefficient register which multiplies the target value by the coefficient;

a boost voltage value holding circuit which holds the boost voltage value; and a second coefficient register which multiplies the boost voltage value by the coefficient.

3. The automatic power control filter circuit according to claim 1, further comprising: a third coefficient register which multiplies the output of the integrator by a desired coefficient.

4. The automatic power control filter circuit according to claim 2, further comprising: a third coefficient register which multiplies the output of the integrator by a desired coefficient.

5. An optical disc device comprising:

a laser light emitting element which irradiates optical disc with a laser beam;

a beam splitter which divides the laser beam;

an objective lens which irradiates the optical disc with a part of the divided laser beam;

a photodetector which receives a part of the divided laser beam and detects output power of the laser light emitting element;

a current-voltage conversion circuit which converts an output current of the photodetector into a light emission monitor signal;

a plurality of sample hold circuits which sample and hold the light emission monitor signal synchronously with a sample pulse on the basis of which laser power for recording marks or spaces to the optical disc is sampled;

analog-digital converters which analog-digital convert output signals of the sample hold circuits;

a plurality of automatic power control filter circuits which correct analog-digital converted output signals of the sample hold circuits to have desired values, and output the corrected signals;

a system controller by which the automatic power control filter circuits are controlled to output desired signals;

digital-analog converters which digital-analog convert the output signals of the automatic power control filter circuits, and output drive current instruction signals that instruct laser drive currents for driving the laser light emitting element;

voltage-current conversion circuits which respectively convert the plurality of drive current instruction signals into a plurality of laser drive currents;

a plurality of switch circuits which turn on and off the plurality of laser drive currents; and an adder which adds the laser drive currents outputted via the switch circuits, and outputs the resultant current to the laser light emitting element, wherein the automatic power control filter circuits comprise an offset adjusting circuit which measures and stores an offset voltage of the signal sampled and held when the laser is prevented from emitting light; a first operation circuit which performs offset correction by subtracting the offset voltage stored in the offset adjusting circuit and the signal sampled and held when the laser is allowed to emit light; a second operation circuit which calculates an error by comparing a value corrected by the first operation circuit with a value obtained by multiplying a target value by a desired coefficient in order to perform optimum power control; an integrator which integrates the error calculated by the second operation circuit; and a third operation circuit which adds the output of the integrator to a voltage value obtained by multiplying a desired boost voltage value by the coefficient, and outputs the adding result, wherein the target value and the boost voltage value are respectively multiplied by the coefficient at the same timing as the optimum power control is performed.

6. The optical disc device according to claim 5, wherein the automatic power control filter circuits further comprise a target value holding circuit which holds the target value; a first coefficient register which multiplies the target value by the coefficient; a boost voltage value holding circuit which holds the boost voltage value; and a second coefficient register which multiplies the boost voltage value by the coefficient.

7. The optical disc device according to claim 5, wherein the automatic power control filter circuits further comprise a third coefficient register which multiplies the output of the integrator by a desired coefficient.

8. The optical disc device according to claim 6, wherein the automatic power control filter circuits further comprise a third coefficient register which multiplies the output of the integrator by a desired coefficient.

* * * * *